United States Patent
Rolandi et al.

[19]

[11] Patent Number: 6,016,271
[45] Date of Patent: Jan. 18, 2000

[54] METHOD AND CIRCUIT FOR GENERATING A GATE VOLTAGE IN NON-VOLATILE MEMORY DEVICES

[75] Inventors: Paolo Rolandi, Voghera; Roberto Gastaldi, Agrate Brianza; Cristiano Calligaro, Torre D'Isola, all of Italy

[73] Assignee: STMicroeletronics S.R.L., Agrate Brianza, Italy

[21] Appl. No.: 09/141,250

[22] Filed: Aug. 27, 1998

[30] Foreign Application Priority Data

Aug. 29, 1997 [EP] European Pat. Off. .............. 97830435

[51] Int. Cl.$^7$ ................................................. G11C 16/04
[52] U.S. Cl. ................................. 365/185.18; 365/185.2; 365/185.21; 365/185.23; 365/185.33
[58] Field of Search ......................... 365/185.03, 185.18, 365/185.19, 185.2, 185.21, 185.23, 185.33

[56] References Cited

U.S. PATENT DOCUMENTS

| | | | |
|---|---|---|---|
| 4,954,990 | 9/1990 | Vider | 365/185.21 |
| 5,119,330 | 6/1992 | Tanagawa | 365/185.21 |
| 5,276,646 | 1/1994 | Kim et al. | 365/189.09 |
| 5,483,486 | 1/1996 | Javanifard et al. | 365/226 |
| 5,511,026 | 4/1996 | Cleveland et al. | 365/226 |
| 5,559,717 | 9/1996 | Tedrow et al. | 365/189.07 |
| 5,566,111 | 10/1996 | Choi | 365/185.2 |
| 5,687,116 | 11/1997 | Kowshik et al. | 365/185.33 |
| 5,822,247 | 10/1998 | Tassan Caser et al. | 365/185.18 |
| 5,838,612 | 11/1998 | Calligaro et al. | 365/185.03 |
| 5,856,946 | 1/1999 | Chan et al. | 365/185.18 |

FOREIGN PATENT DOCUMENTS

| | | |
|---|---|---|
| 394705 | 10/1990 | European Pat. Off. . |
| 656629 | 6/1995 | European Pat. Off. . |
| 735542 | 10/1996 | European Pat. Off. . |
| 0786777 A1 | 7/1997 | European Pat. Off. ........ G11C 16/00 |

*Primary Examiner*—Trong Phan
*Attorney, Agent, or Firm*—Allen, Dyer, Doppelt, Milbrath & Gilchrist, P.A.

[57] ABSTRACT

A circuit generates a regulated voltage, in particular for gate terminals of non-volatile memory cells of the floating gate type. The circuit includes a generator circuit adapted to generate an unregulated voltage on its output. A comparator circuit is coupled to the output of the generator circuit including a reference element including a non-volatile memory cell of the floating gate type and adapted to output an error signal tied to the difference between the unregulated voltage and the threshold voltage of the cell. A regulator circuit is coupled to the output of the comparator circuit and is operative to regulate the unregulated voltage based on the value of the error signal. The regulated voltage is made programmable and tied to the parameters of the memory cell.

25 Claims, 2 Drawing Sheets

6,016,271

METHOD AND CIRCUIT FOR GENERATING A GATE VOLTAGE IN NON-VOLATILE MEMORY DEVICES

FIELD OF THE INVENTION

This invention relates to memories, and, more particularly, to a method and a circuit for generating a regulated voltage for a non-volatile memory.

BACKGROUND OF THE INVENTION

Voltage regulators are circuits which have been employed for years by the electronic industry. More recently, they made their inception in non-volatile storage devices which comprise cells including MOS transistors with a floating gate terminal, such as memories of the EPROM, EEPROM and FLASH types. In fact, a reducing supply voltage, expanding integration scale, and growing amount of binary information to be stored in a single cell, lead to the need for read, write and erase signals controlled with greater accuracy.

A non-volatile storage system of the multi-level type is known from Patent Application EP 394,705. This includes a gate voltage generation circuit, shown in FIG. 4(a), which includes a clock pulse generator 40, a charge pump circuit 60, and a regulator circuit 100, all connected in cascade with one another. The circuit also includes a voltage control circuit 80 having its input connected to the output of the circuit 60 and its output connected to a stop terminal of the circuit 40. The voltage control circuit 80 includes a comparator 86 having a negative input connected to ground through a load resistor 84, and a positive input for receiving a data voltage signal which has a value in the 0 to 5 volts range. The voltage control circuit also includes a Zener diode 82 having a Zener voltage of 15 volts, a cathode connected to the input of the control circuit 80, and an anode connected to the negative input of the comparator 86. The output of the comparator 86 is connected to the output of the control circuit 80.

The operation of this gate voltage generation circuit follows readily from FIG. 4(b). Regulation is realized at a value equal to the combined data and Zener voltages. It should be noted, however, that during a cell reading operation, the 5 volt supply voltage VDD is applied to the gate of the memory cell, as shown in FIG. 9.

Another gate voltage generation circuit for use in non-volatile memories of the multi-level or the low supply voltage type is known from Patent Application EP 656,629. During the reading operation, the gate voltage is supplied by a charge pump circuit driven by an oscillator, and has a higher value than the system supply voltage to provide for an ample working margin between storage states. The resulting voltage is then regulated by a Zener diode, as shown in FIG. 3.

Both prior regulators are based on a highly accurate reference element including a Zener diode. Accordingly, the regulated voltage value is set at the designing stage, and cannot be changed either by the user or by the manufacturer at the EWS (Electrical Wafer Sort) stage, for example. Also, the Zener diodes are not always easy to integrate with CMOS technology.

In addition, the performance of memory cells changes over time, e.g. with temperature variations. Thus, for a given storage state and a given reading gate voltage value, the current flowing through a cell may take significantly different values. This typically requires the choice of large working margins.

SUMMARY OF THE INVENTION

An object of the present invention is to provide a method and a circuit for generating a regulated voltage, particularly for gate terminals of non-volatile memory cells of the floating gate type, which can obviate the drawbacks of the prior art.

BRIEF DESCRIPTION OF THE DRAWINGS

The invention can be better understood by reading the following description along with the accompanying drawings, in which.

DETAILED DESCRIPTION OF THE PREFERRED EMBODIMENTS

Figure 1:
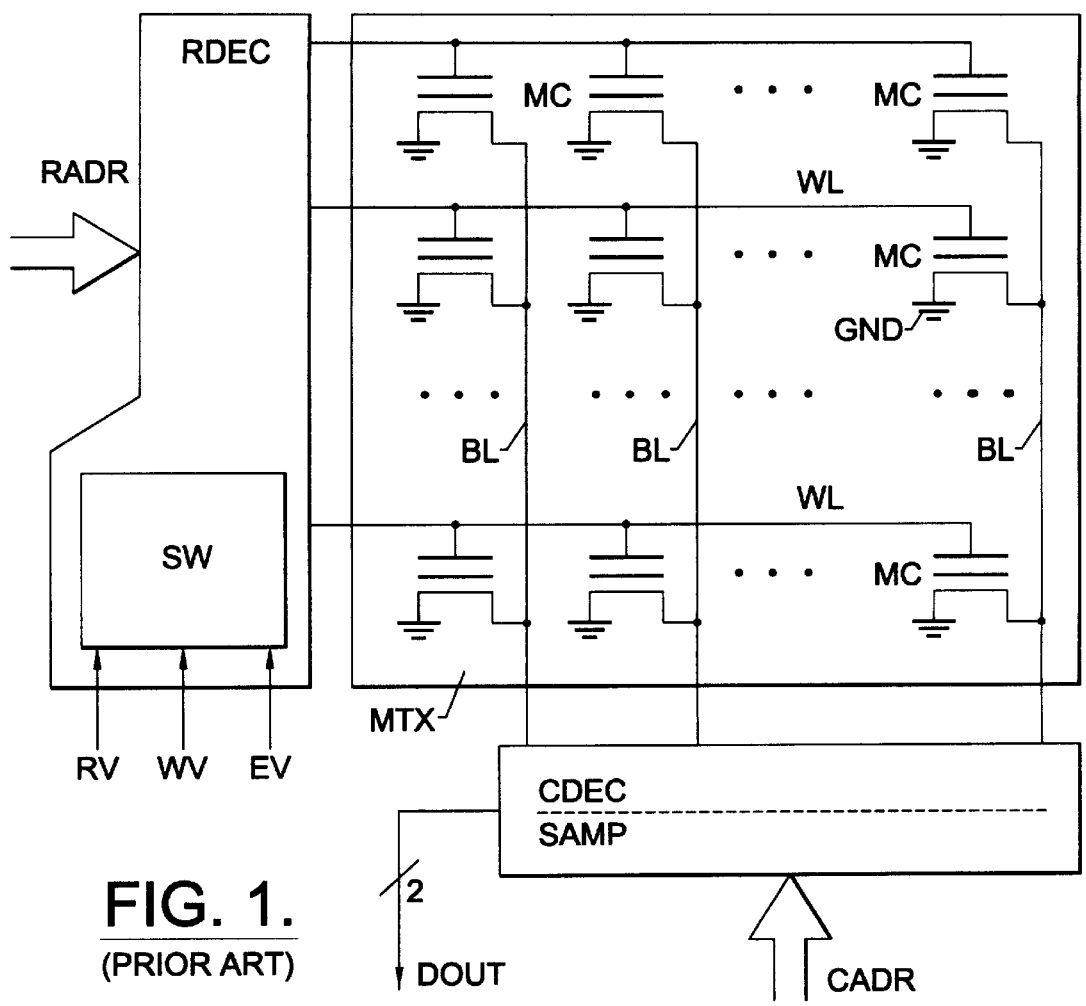
FIG. 1 is a schematic, fragmentary block diagram of a FLASH storage device of the multi-level type as in the prior art.

As previously mentioned, this invention is especially useful for non-volatile storage devices which comprise cells formed of MOS transistors with a floating gate terminal, such as that illustrated in the schematic diagram of FIG. 1. This comprises a plurality of memory cells MC organized into a matrix MTX. The source terminals of the cells MC are connected to a ground GND; the gate terminals are connected together as rows and to word lines WL; and the drain terminals are connected together as columns and to bit lines BL. The word lines WL are connected to a row decoder RDEC which receives a row address RADR on its input. The bit lines BL are connected to a column decoder CDEC which receives a column address CADR on its input.

Since the device of FIG. 1 is a FLASH memory, the cells MC have no selection transistors, and the decoder RDEC is input a read voltage RV, write voltage WV, and erase voltage EV, to selectively supply them, through a switching circuit SW, to the lines WL consistent with the operation to be executed. Associated with and connected to the decoder CDEC is a read amplifier SAMP which is effective to produce, on an output DOUT, 2 bits corresponding to the binary coding of the storage state in the selected memory cell. This is, therefore, a multi-level storage device, specifically a four-level storage device. A read amplifier suited for non-volatile memories of the multi-level type, and adapted for use in the device of FIG. 1, is illustrated in Patent Application EP 735,542, for example.

It will be recalled that the threshold voltage Vth of floating gate MOS transistors can be controlled by injecting or extracting charges into/from the floating gate. In a four-level device, the distribution DIS of the cell threshold voltage for the four different storage states ("11", "10", "01", "00") may be that shown in FIG. 2, for example. The distributions are of bell-like shape, and their midpoint values may be, for example: 2.0 volts (virgin cell), 3.1 volts, 4.5 volts, and 6.2 volts. In general, their width increases with the midpoint value. For reliable reading at a low error rate, suitably spaced narrow distributions are needed.

Figure 2:
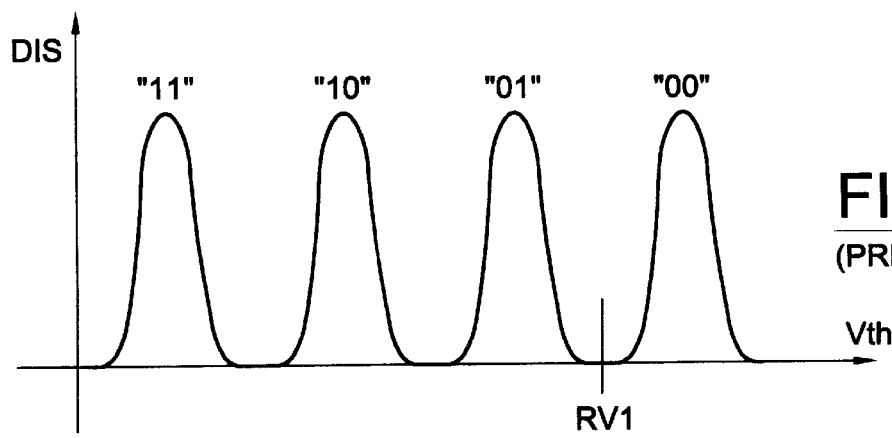
FIG. 2 illustrates the distribution of the cell threshold voltage for four different storage states as in the prior art.

With the distributions spaced apart as shown in FIG. 2, and if the supply voltage VCC can be varied, according to specification, from 4.5 volts to 5.5 volts, a proper and safe discrimination between the states "01" and "00" requires that a sufficiently regulated reading gate voltage RV1 be generated and used, e.g. 5.35 volts (mean value of 4.5 and 6.2). This value is higher than the specified minimum supply voltage. With more widely spaced distributions, the value of the read voltage RV1 must be much higher than the value of the supply voltage VCC.

A similar problem to that of multi-level memories may be encountered in two-level devices if the supply voltage VCC is low, i.e. equal to or just slightly higher than the threshold voltage of the virgin cell. It will be recalled that, with FLASH devices, it is generally necessary to effect the reading of a cell both during the reading operation proper, and during the write and/or erase operations as the result of the operation being verified.

The invention will be illustrated hereinafter mainly with reference to FIG. 3. The method for generating a regulated voltage, according to this invention, provides for the use, as a reference element for the regulating operation, of a non-volatile memory reference cell REFC of the floating gate type.

For the regulated voltage value to closely track the changes in performance of the memory cells, it is preferred that the cell REFC be substantially identical with the cells MC of the plurality MTX being read. If the threshold voltage of the cell REFC has an unsuitable value, it will be necessary to program the cell REFC at a predetermined threshold voltage value before the start of the regulating operation. With the circuit of FIG. 3 and the distributions of FIG. 2, the cell REFC should be programmed at a threshold voltage value RV1 corresponding to a value intermediate the distributions "01" and "00", e.g. 5.35 volts. Such programming can be effected at the EWS stage with high accuracy ($\pm 1\mu A$) by accessing the cell directly.

The generation circuit of this invention comprises, therefore:

a) a generator circuit adapted to output an unregulated voltage VCHP;

b) a comparator circuit coupled to the output of the generator circuit and adapted to output an electric error signal ID tied to the difference between the voltage VCHP and an internal reference voltage; and c) a regulator circuit coupled to the output of the comparator circuit and operative to regulate the voltage VCHP based on the value of the signal ID.

The comparator circuit includes a reference element including a non-volatile memory cell REFC of the floating gate type whose threshold voltage corresponds to the internal reference voltage. The comparator circuit can be implemented in any of several ways: for example, using a reference generator coupled to a voltage comparator.

In a very simple and effective embodiment, this circuit is only basically formed using the cell REFC. In this case, the output of the generator circuit is coupled to the gate terminal of the cell REFC, and the regulator circuit and receives as an input the error signal ID, which is the current which is flowing through the cell. The regulator circuit will regulate the voltage VCHP accordingly.

There are several possible ways of implementing the regulation of a voltage. One embodiment, borrowed from linear regulators, includes connecting the main conduction path of a transistor in series with the unregulated voltage generator, and driving the gate terminal of the transistor such that the voltage drop across its main conduction path will compensate for the variations in the unregulated voltage.

In contrast, the method of this invention provides for the regulation to be effected by prompting, according to necessity, a current sinking from the output of the unregulated voltage generator circuit. In fact, if this generator has a sufficiently high output resistance, as would be the case where the circuit of this invention is used to drive very small loads, such as the gate terminals of MOS transistors, a small current sinking brings about a fairly large voltage drop. This can be easily implemented using a regulating transistor TR, included in the regulator circuit, with its main conduction path coupled between the output of the generator circuit and a reference of potential, e.g. the ground GND.

A typical way of implementing the generator circuit in the instance of non-volatile memories, includes connecting an oscillator circuit OSC, adapted to generate an oscillating signal on its output, in cascade with a charge pump circuit CHP. In this case, the output resistance is bound to be fairly high.

It is advantageous to arrange for the regulation to produce, in addition to the current sinking, a discontinuance in the generation of the unregulated voltage VCHP if a large current flows through the reference cell REFC, that is, if the unregulated voltage VCHP is high. Where the generator circuit includes an oscillator circuit OSC and a charge pump circuit CHP, this can be readily and effectively obtained by arranging for the charge pump circuit to be inhibited from receiving the oscillating signal on its input. For the purpose, the oscillator circuit OSCC may be provided with an activation control input coupled to an output of the regulator circuit.

When incorporated into a storage device comprising a plurality MTX of non-volatile memory cells MC of the floating gate type, the generation circuit of this invention can be utilized for powering the gate terminals of the cells MC, especially during reading operations. It will then be advantageous if the cell REFC is of the same type as the cells MC, preferably identical therewith.

For the regulated voltage value to closely track the changes in the memory cell performance, the regulator circuit may include circuitry coupled to the cell REFC to mimic the operation of the circuitry coupled to the cells MC, that is, the decoder CDEC and amplifier SAMP in FIG. 1.

Figure 3:
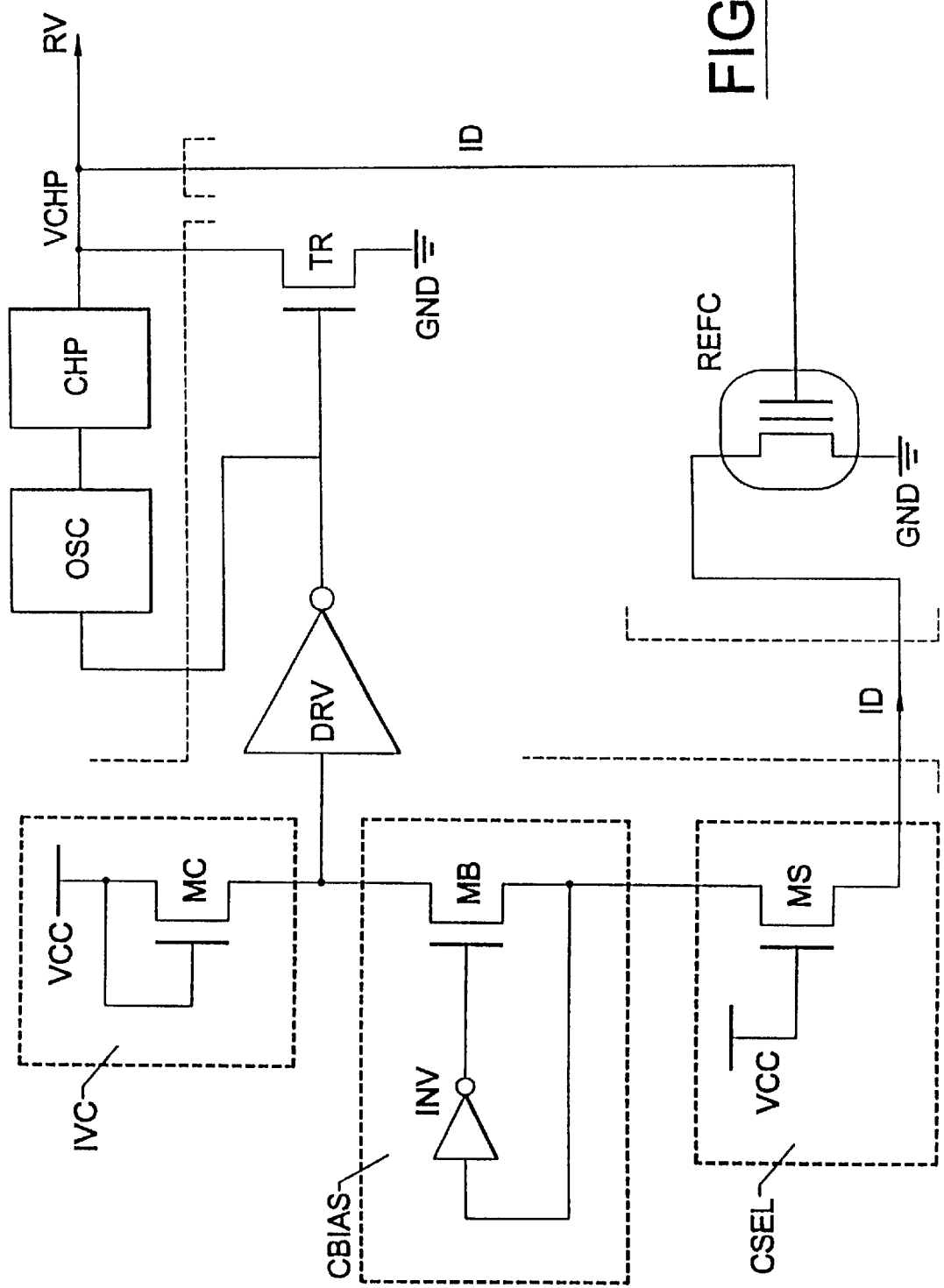
FIG. 3 is a mixed circuit/block diagram of a generating circuit according to the invention.

In the embodiment shown in FIG. 3, the generation circuit includes an oscillator circuit OSC having an activation control input and an output for delivering an oscillating signal. Upon the control input being delivered a signal at a predetermined high logic level, the operation of the circuit OSC is deactivated. The output of the circuit OSC is connected to an input of a charge pump circuit CHP which has an output for supplying an unregulated voltage VCHP. The output of the circuit CHP is connected to the gate terminal of a floating gate NMOS transistor which functions as a non-volatile memory reference cell REFC. Its source terminal is connected to ground GND. This cell can be factory programmed at the EWS (Electrical Wafer Sort) stage with great accuracy, e.g. with a current error on the order of 1 $\mu A$.

The drain terminal of the cell REFC is connected to the input of the regulator circuit, specifically to the source terminal of a transistor MS of the N-MOS type whose gate terminal is connected to the power supply VCC. This transistor MS and its connections form a circuit block CSEL intended to mimic, for the cell REFC, the effect of the decoder CDEC on the cells MC of the matrix MTX. When the cell REFC is conductive, the transistor MS is conductive and the voltage drop across the drain and source terminals is small.

The drain terminal of the transistor MS is connected directly to the source terminal of a transistor MB of the N-MOS type, and through an inverter INV, to the gate terminal thereof. The combined transistor MB and inverter INV form a circuit block CBIAS intended to bias the drain terminal of the cell REFC to about 1 volt, and for emulating the biasing of the cells MC of the matrix MTX effected within the amplifier SAMP. For so doing, the inverter INV should have an input threshold of about 1 volt, and drive the transistor MB such that the transistor MB will let through the current of the cell REFC and decouple it voltage-wise from the circuitry downstream. Its output logic levels may be, as an example, 0.0 volts and 2.5 volts for a supply voltage of 5.0 volts.

The drain terminal of the transistor MB is connected to the source terminal of a transistor MC of the N-MOS type having its gate and drain terminals connected together and to the power supply VCC. This transistor MC with its connections forms a circuit block IVC intended to emulate the current/voltage conversion stage of the amplifier SAMP. Alternatively, the block IVC could be formed of a transistor MC of the P-MOS type having its gate terminal connected to the ground GND. In this way, the action of the control circuit would be more effective, but at the expense of inferior control precision because the potential at the drain terminal of the transistor MC would then be free to drop far below the supply potential VCC.

The source terminal of the transistor MC is connected to the input of an inverting-effect drive circuit DRV having a high input impedance. It could be either implemented by an inverter with a suitable input threshold and suitable output logic levels, or by an amplifier having a suitable transfer characteristic. The choice will be dictated by the type of regulation sought: either substantially linear or substantially digital.

The output of the circuit DRV is connected to the activation control input of the oscillator circuit OSC, and to the gate terminal of a transistor TR of the N-MOS type which has its source terminal connected to the ground GND and its drain terminal connected to the output of the charge pump circuit CHP. When the voltage VCHP rises above the threshold voltage of the cell REFC, the latter will conduct a current ID which causes the potential at the input of the circuit DRV to decrease. The voltage at the output of the circuit DRV rises, sets the transistor TR to conduction, and may de-activate the circuit OSC, depending on its value and design options. Therefore, the voltage VCHP will be pulled down.

The regulation thus obtained is strictly dependent on design options and the circuit dimensioning. In addition, it should be noted that, at the output of the charge pump circuit CHP, there is an oscillating signal with a period on the order of 1 μs, and that the duration of a reading operation is on the order of 10 ns. In the instance of storage devices, what is of interest is not regulation as such, but rather the capability to provide a reliable reading with a low error rate. For example, ±40 mV regulation may be ample.

That which is claimed is:

1. A circuit for generating a regulated voltage for gate terminals of non-volatile memory cells of a floating gate type, comprising:

a generator circuit adapted to generate an unregulated voltage on an output thereof;

a comparator circuit coupled to the output of the generator circuit and adapted to output an error signal based upon a difference between the unregulated voltage and an internal reference voltage;

a regulator circuit coupled to the output of the comparator circuit and operative to regulate the unregulated voltage based on the value of the error signal, said regulator circuit including a transistor having a source, drain and gate, said gate of said transistor connected to a power supply;

said comparator circuit comprising a reference non-volatile memory cell of the floating gate type having a threshold voltage corresponding to the internal reference voltage, and wherein said reference non-volatile memory cell includes a drain connected to said source of the transistor in the regulator circuit; and a circuit for biasing the drain of the reference non-volatile memory cell, wherein the non-volatile memory reference cell before the start of any voltage regulating operation is programmed at a threshold voltage RV1 corresponding to a value intermediate distributions "01" and "00" and between about 4.5 and 6.2 volts.

2. A circuit according to claim 1, wherein the output of the generator circuit is coupled to a gate of the reference non-volatile memory cell; and wherein the regulator circuit receives on an input current flowing through the reference non-volatile memory cell.

3. A circuit according to claim 1, wherein the regulator circuit comprises a regulating transistor having a main conduction path coupled between the output of the generator circuit and a reference potential.

4. A circuit according to claim 1, wherein said generator circuit comprises an oscillator circuit and a charge pump circuit coupled in cascade.

5. A circuit according to claim 1, wherein said generator circuit comprises an oscillator circuit having an activation control input and a charge pump circuit coupled in cascade, and wherein said regulator circuit has an output coupled to the activation control input of the oscillator circuit.

6. A storage device comprising:

a plurality of non-volatile memory cells of the floating gate type;

a regulated voltage circuit for generating a regulated voltage for gate terminals of non-volatile memory cells comprising;

a generator circuit adapted to generate an unregulated voltage on an output thereof;

a comparator circuit coupled to the output of the generator circuit and adapted to output an error signal based upon a difference between the unregulated voltage and an internal reference voltage;

a regulator circuit coupled to the output of the comparator circuit and operative to regulate the unregulated voltage based on the value of the error signal, said regulator circuit including a transistor having a source, drain and gate, said gate connected to a power supply;

said comparator circuit further comprising a reference non-volatile memory cell of the floating gate type having a threshold voltage corresponding to the internal reference voltage, and wherein said reference non-volatile memory cell includes a drain connected to said source of the transistor in the regulator circuit; and a circuit for biasing the drain of the reference non-volatile memory cell, wherein the non-volatile memory reference cell before the start of any regulating operation is programmed at a threshold voltage RV1 corresponding to a value intermediate distributions "01" and "00" between about 4.5 and 6.2 volts.

7. A storage device according to claim 6, wherein the output of the generator circuit is coupled to a gate of the reference non-volatile memory cell; and wherein the regulator circuit receives on an input current flowing through the reference non-volatile memory cell.

8. A storage circuit according to claim 6, wherein the regulator circuit comprises a regulating transistor having a main conduction path coupled between the output of the generator circuit and a reference potential.

9. A storage circuit according to claim 6, wherein said generator circuit comprises an oscillator circuit and a charge pump circuit coupled in cascade.

10. A storage device according to claim 6, wherein said generator circuit comprises an oscillator circuit having an activation control input and a charge pump circuit coupled in cascade, and wherein said regulator circuit has an output coupled to the activation control input of the oscillator circuit.

11. A storage device according to claim 6, wherein each of non-volatile memory cells is adapted to store more than one element of binary information.

12. A storage device according to claim 6, wherein each of said non-volatile memory cells is adapted to operate at a supply voltage below a predetermined value.

13. A storage device according to claim 6, further comprising a switching circuit adapted to only couple said regulated voltage circuit to the gate terminals of the non-volatile memory cells during reading operations of the device.

14. A storage device according to claim 6, further comprising circuitry coupled to said non-volatile memory cells; and wherein the regulated voltage circuit further comprises circuitry coupled to the non-volatile memory cell which mimics operation of the circuitry coupled to the non-volatile memory cells.

15. A method for generating a regulated voltage for gate terminals of a plurality of non-volatile memory cells of the floating gate type, the method comprising the step of:

generating the regulated voltage using, as reference element, a non-volatile memory reference cell of the floating gate type which is substantially identical with the plurality of non-volatile memory cells; and programming the non-volatile memory reference cell before the start of any voltage regulating operation at a threshold voltage RV1 corresponding to a value intermediate distributions "01" and "00" between about 4.5 and 6.2 volts.

16. A method according to claim 15, further comprising the step of programming the non-volatile memory reference cell to a predetermined threshold value before starting the generating step.

17. A method according to claim 15, further comprising the steps of:

causing a generator circuit to generate an unregulated voltage on an output thereof;

supplying the unregulated voltage to a gate of the non-volatile memory reference cell; and regulating the unregulated voltage by current flowing through the non-volatile memory reference cell.

18. A method according to claim 17, wherein the step of regulating comprises producing a current sinking from the output of the generator circuit.

19. A method according to claim 18, wherein the step of regulating further comprises discontinuing the generation of the unregulated voltage responsive to the current flowing through the reference cell being above a threshold.

20. A method according to claim 18, wherein the step of generating comprises causing an oscillator circuit to generate an oscillating signal delivered to a charge pump circuit.

21. A method for generating a regulated voltage for gate terminals of a plurality of non-volatile memory cells of the floating gate type, the method comprising the step of:

providing, as reference element, a non-volatile memory reference cell of the floating gate type which is substantially identical with the plurality of non-volatile memory cells;

causing a generator circuit to generate an unregulated voltage on an output thereof;

supplying the unregulated voltage to a gate of the non-volatile memory reference cell;

regulating the unregulated voltage by current flowing through the non-volatile memory reference cell; and programming the non-volatile memory reference cell before the start of any voltage regulating operation at a threshold voltage RV1 corresponding to a value intermediate distributions "01" and "00" between about 4.5 and 6.2 volts.

22. A method according to claim 21, further comprising the step of programming the non-volatile memory reference cell to a predetermined threshold value before the regulating step.

23. A method according to claim 21, wherein the step of regulating comprises producing a current sinking from the output of the generator circuit.

24. A method according to claim 21, wherein the step of regulating further comprises dicontinuing the generation of the unregulated voltage responsive to the current flowing through the reference cell being above a threshold.

25. A method according to claim 21, wherein the step of generating comprises causing an oscillator circuit to generate an oscillating signal delivered to a charge pump circuit.

* * * * *

UNITED STATES PATENT AND TRADEMARK OFFICE
CERTIFICATE OF CORRECTION

PATENT NO. : 6,016,271
DATED : January 18, 2000
INVENTOR(S) : Paolo Rolandi, et al.

It is certified that error appears in the above-identified patent and that said Letters Patent is hereby corrected as shown below:

On the title page:

[73] Assignee     Strike: STMicroeletronics, S.R.L.
                      Insert: STMicroelectronics, S.r.l.

Column 2, Line 8     Insert:

--This and other objects in accordance with the present invention are provided by a method for generating a regulated voltage for gate terminals of a plurality of non-volatile memory cells of the floating gate type. The method preferably comprises the step of: generating the regulated voltage using, as reference element, a non-volatile memory reference cell of the floating gate type which is substantially identical with the plurality of non-volatile memory cells. The method may further include the step of programming the non-volatile memory reference cell to a predetermined threshold value before starting the generating step.

UNITED STATES PATENT AND TRADEMARK OFFICE
CERTIFICATE OF CORRECTION

PATENT NO. : 6,016,271
DATED : January 18, 2000
INVENTOR(S) : Paolo Rolandi, et al.

It is certified that error appears in the above-identified patent and that said Letters Patent is hereby corrected as shown below:

The method may also include the steps of: causing a generator circuit to generate an unregulated voltage on an output thereof, supplying the unregulated voltage to a gate of the non-volatile memory reference cell, and regulating the unregulated voltage by current flowing through the non-volatile memory reference cell. The step of regulating may include producing a current sinking from the output of the generator circuit. The step of regulating may further comprise discontinuing the generating of the unregulated voltage responsive to the current flowing through the reference cell being above a threshold. In addition, the step of generating may include causing an oscillator circuit to generate an oscillating signal delivered to a charge pump circuit.

UNITED STATES PATENT AND TRADEMARK OFFICE
CERTIFICATE OF CORRECTION

PATENT NO. : 6,016,271
DATED : January 18, 2000
INVENTOR(S) : Paolo Rolandi, et al.

It is certified that error appears in the above-identified patent and that said Letters Patent is hereby corrected as shown below:

Another aspect of the invention relates to a circuit for generating a regulated voltage for gate terminals of non-volatile memory cells of a floating gate type. The circuit preferably comprises a reference non-volatile memory cell of the floating gate type which is substantially identical with the plurality of non-volatile memory cells; and means for generating the regulated voltage using, as reference element, the reference non-volatile memory reference cell. The means for generating may include a generator circuit adapted to generate an unregulated voltage on an output thereof, a comparator circuit coupled to the output of the generator circuit and adapted to output an error signal based upon a difference between the unregulated voltage and an internal reference voltage, and a regulator circuit coupled to the output of the comparator circuit and operative to regulate the unregulated voltage based on the value of the error signal. The reference non-volatile memory cell may have a threshold voltage corresponding to the internal reference voltage.--

Signed and Sealed this

Tenth Day of October, 2000

*Attest:*

Q. TODD DICKINSON

*Attesting Officer*      *Director of Patents and Trademarks*